United States Patent
Uyeno et al.

(10) Patent No.: US 11,333,879 B2
(45) Date of Patent: *May 17, 2022

(54) ELECTRONICALLY STEERED INTER-SATELLITE OPTICAL COMMUNICATION SYSTEM WITH MICRO-ELECTROMECHANICAL (MEM) MICROMIRROR ARRAY (MMA)

(71) Applicant: Raytheon Company, Waltham, MA (US)

(72) Inventors: Gerald P. Uyeno, Tucson, AZ (US); Sean D. Keller, Tucson, AZ (US); Benn H. Gleason, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/007,917

(22) Filed: Aug. 31, 2020

(65) Prior Publication Data

US 2021/0091854 A1  Mar. 25, 2021

Related U.S. Application Data

(60) Provisional application No. 62/903,244, filed on Sep. 20, 2019.

(51) Int. Cl.
*H04B 10/112* (2013.01)
*H04B 10/118* (2013.01)
*H04J 14/02* (2006.01)
*G02B 26/08* (2006.01)
(Continued)

(52) U.S. Cl.
CPC ........ *G02B 26/0841* (2013.01); *B81B 3/0062* (2013.01); *G02B 6/3512* (2013.01);
(Continued)

(58) Field of Classification Search
CPC .............................................. H04B 10/11–118
(Continued)

(56) References Cited

U.S. PATENT DOCUMENTS 5,404,375 A * 4/1995 Kroeger ................. H04B 7/216
375/132
5,854,702 A * 12/1998 Ishikawa ............ H04B 10/0795
398/137
(Continued)

FOREIGN PATENT DOCUMENTS

DE 102011104023.8 B4 7/2019
EP 2667142 A1 11/2013
(Continued)

OTHER PUBLICATIONS

Kim et al.: "Demonstration of large-angle nonmechanical laser beam steering based on LC polymer polarization grating", Proc.. of SPIE vol. 8052 80520T, May 13, 2011 (Year: 2011).*
(Continued)

*Primary Examiner* — Li Liu
(74) *Attorney, Agent, or Firm* — Schwegman Lundberg & Woessner, P.A.

(57) ABSTRACT

Embodiments of a satellite transceiver configurable for inter-satellite communication and configurable for satellite to ground communication are disclosed herein. In some embodiments, the satellite transceiver comprises a micro-electromechanical (MEM) micro-mirror array (MMA) (MEM-MMA) configured to steer a beam of encoded optical data over a field-of-view (FOV). The MEM-MMA comprises a plurality of individual mirror elements. Each of the mirror elements is controllable by control circuitry to steer the beam over the FOV.

20 Claims, 2 Drawing Sheets

(51) Int. Cl.
| | |
|---|---|
| *H04Q 11/00* | (2006.01) |
| *G02B 6/35* | (2006.01) |
| *H04B 10/29* | (2013.01) |
| *H04B 10/40* | (2013.01) |
| *H04B 10/50* | (2013.01) |
| *H04B 10/66* | (2013.01) |
| *B81B 3/00* | (2006.01) |
| *G02B 26/10* | (2006.01) |
| *H04N 5/217* | (2011.01) |

(52) U.S. Cl.
CPC ....... *G02B 26/0833* (2013.01); *G02B 26/101* (2013.01); *H04B 10/118* (2013.01); *H04B 10/1123* (2013.01); *H04B 10/29* (2013.01); *H04B 10/40* (2013.01); *H04B 10/50* (2013.01); *H04B 10/66* (2013.01); *H04J 14/02* (2013.01); *H04J 14/0267* (2013.01); *H04N 5/2176* (2013.01); *H04Q 11/0005* (2013.01); *B81B 2203/053* (2013.01)

(58) Field of Classification Search
USPC .................................................. 398/118–131
See application file for complete search history.

(56) References Cited

U.S. PATENT DOCUMENTS

| | | | | |
|---|---|---|---|---|
| 6,181,450 B1* | 1/2001 | Dishman | ............. | H04B 10/118 398/122 |
| 6,271,953 B1* | 8/2001 | Dishman | ............. | H04B 10/118 398/129 |
| 6,327,063 B1* | 12/2001 | Rockwell | ............. | H04B 10/118 398/122 |
| 6,526,352 B1 | 2/2003 | Breed et al. | | |
| 6,567,574 B1 | 5/2003 | Ma et al. | | |
| 6,792,028 B2 | 9/2004 | Cook et al. | | |
| 6,816,315 B1 | 11/2004 | Ai et al. | | |
| 7,304,296 B2 | 12/2007 | Mills et al. | | |
| 7,593,641 B2* | 9/2009 | Tegge, Jr. | ............. | H04B 10/118 398/118 |
| 7,626,152 B2 | 12/2009 | King et al. | | |
| 7,660,235 B2 | 2/2010 | Alicherry et al. | | |
| 7,667,190 B2 | 2/2010 | Mills et al. | | |
| 7,884,997 B2 | 2/2011 | Goodno | | |
| 7,969,558 B2 | 6/2011 | Hall | | |
| 8,164,037 B2 | 4/2012 | Jenkins et al. | | |
| 8,301,027 B2* | 10/2012 | Shaw | ............. | H01S 5/423 398/88 |
| 8,305,578 B1 | 11/2012 | Mudge et al. | | |
| 8,311,372 B2 | 11/2012 | Anderson et al. | | |
| 8,364,334 B2 | 1/2013 | Au et al. | | |
| 8,368,889 B2 | 2/2013 | Schwiegerling et al. | | |
| 8,380,025 B2 | 2/2013 | Anderson et al. | | |
| 8,400,619 B1 | 3/2013 | Bachrach et al. | | |
| 8,463,080 B1 | 6/2013 | Anderson et al. | | |
| 8,767,190 B2 | 7/2014 | Hall | | |
| 8,823,848 B2 | 9/2014 | Chipman et al. | | |
| 8,983,293 B2 | 3/2015 | Frankel et al. | | |
| 8,995,038 B1 | 3/2015 | Anderson et al. | | |
| 9,473,768 B2 | 10/2016 | Uyeno et al. | | |
| 9,477,135 B1* | 10/2016 | Uyeno | ............. | G02F 1/295 |
| 9,632,166 B2 | 4/2017 | Trail et al. | | |
| 9,857,226 B2 | 1/2018 | LeMaster et al. | | |
| 9,904,081 B2 | 2/2018 | Uyeno et al. | | |
| 9,927,515 B2 | 3/2018 | Keller et al. | | |
| 9,946,259 B2 | 4/2018 | Keller et al. | | |
| 10,062,175 B2 | 8/2018 | Uyeno et al. | | |
| 10,148,056 B2 | 12/2018 | Uyeno et al. | | |
| 10,209,439 B2 | 2/2019 | Keller et al. | | |
| 10,243,654 B1* | 3/2019 | Uyeno | ............. | H04B 10/40 |
| 10,267,915 B2 | 4/2019 | Uyeno et al. | | |
| 10,321,037 B2 | 6/2019 | Uyeno et al. | | |
| 10,381,701 B2 | 8/2019 | Motoi | | |
| 10,444,492 B2* | 10/2019 | Hopkins | ............. | G02B 26/0841 |
| 10,718,491 B1* | 7/2020 | Raring | ............. | H01S 5/343 |
| 10,969,598 B2 | 4/2021 | Fest et al. | | |
| 10,998,965 B2* | 5/2021 | Tong | ............. | H04B 7/2041 |
| 11,042,025 B2 | 6/2021 | Uyeno et al. | | |
| 2002/0141689 A1* | 10/2002 | Qian | ............. | G02B 6/3588 385/18 |
| 2002/0196506 A1* | 12/2002 | Graves | ............. | H04B 10/1125 398/126 |
| 2003/0062468 A1 | 4/2003 | Byren et al. | | |
| 2003/0081321 A1 | 5/2003 | Moon et al. | | |
| 2003/0185488 A1 | 10/2003 | Blumenthal | | |
| 2004/0072540 A1* | 4/2004 | Wilson | ............. | H04B 10/40 455/41.2 |
| 2004/0081466 A1* | 4/2004 | Walther | ............. | H04B 10/1143 398/152 |
| 2004/0141752 A1* | 7/2004 | Shelton | ............. | H04B 10/1127 398/120 |
| 2004/0258415 A1* | 12/2004 | Boone | ............. | H04B 10/1125 398/125 |
| 2005/0031255 A1 | 2/2005 | Schroeder et al. | | |
| 2005/0100339 A1* | 5/2005 | Tegge, Jr. | ............. | H04B 10/118 398/125 |
| 2005/0122566 A1* | 6/2005 | Cicchiello | ............. | G02F 1/292 359/298 |
| 2005/0288031 A1* | 12/2005 | Davis | ............. | H04W 40/06 455/452.1 |
| 2006/0038103 A1* | 2/2006 | Helmbrecht | ............. | G02B 26/0825 248/346.01 |
| 2007/0031157 A1* | 2/2007 | Yamada | ............. | H04B 10/116 398/198 |
| 2007/0036480 A1 | 2/2007 | Wu | | |
| 2008/0050064 A1 | 2/2008 | Sakai et al. | | |
| 2010/0030473 A1 | 2/2010 | Au et al. | | |
| 2010/0149533 A1 | 6/2010 | Fest | | |
| 2010/0166430 A1* | 7/2010 | Alten | ............. | H04B 10/1141 398/135 |
| 2012/0002973 A1* | 1/2012 | Bruzzi | ............. | H01Q 13/0208 398/116 |
| 2012/0008133 A1 | 1/2012 | Silny et al. | | |
| 2012/0114337 A1* | 5/2012 | Aoki | ............. | H04B 10/1121 398/135 |
| 2012/0155885 A1 | 6/2012 | Hannah et al. | | |
| 2013/0271818 A1* | 10/2013 | Maxik | ............. | H04N 9/3194 359/291 |
| 2014/0063299 A1 | 3/2014 | Fest et al. | | |
| 2015/0099476 A1* | 4/2015 | Beals | ............. | H04N 21/42204 455/83 |
| 2015/0172218 A1 | 6/2015 | Beshai | | |
| 2015/0311981 A1* | 10/2015 | Inagaki | ............. | H04B 10/40 398/135 |
| 2015/0378242 A1* | 12/2015 | Auxier | ............. | G02B 6/2753 385/8 |
| 2016/0003677 A1 | 1/2016 | Pezzaniti et al. | | |
| 2016/0043800 A1* | 2/2016 | Kingsbury | ............. | H04B 7/18513 398/125 |
| 2016/0234703 A1* | 8/2016 | Aldana | ............. | H04W 72/0446 |
| 2016/0294472 A1* | 10/2016 | Palmer | ............. | H04B 7/0617 |
| 2017/0293137 A1 | 10/2017 | Zhao et al. | | |
| 2018/0231715 A1 | 8/2018 | Bishop et al. | | |
| 2019/0154921 A1 | 5/2019 | Xing et al. | | |
| 2020/0244359 A1* | 7/2020 | Csonka | ............. | H04B 10/112 |
| 2021/0088776 A1 | 3/2021 | Uyeno et al. | | |
| 2021/0092260 A1 | 3/2021 | Uyeno et al. | | |

FOREIGN PATENT DOCUMENTS

| | | |
|---|---|---|
| EP | 2533003 B1 | 8/2018 |
| JP | 5606755 | 10/2014 |
| WO | WO-2014200581 A2 | 12/2014 |

OTHER PUBLICATIONS

U.S. Appl. No. 16/871,602, filed May 11, 2020, Optical Data Communication Using Micro-Electro-Mechanical System (MEMS) Micro-Mirror Arrays.

(56) References Cited

OTHER PUBLICATIONS

"U.S. Appl. No. 16/871,602, Non Final Office Action dated Nov. 9, 2020", 18 pgs.
"U.S. Appl. No. 16/871,602, Notice of Allowance dated Feb. 24, 2021", 5 pgs.
"U.S. Appl. No. 16/871,602, Response filed Feb. 8, 21 to Non Final Office Action dated Nov. 9, 2020", 12 pgs.
"Mirrorcle Technologies MEMS Mirrors—Technical Overview", Mirrorcle Technologies, Inc., (2018), 7 pgs.
U.S. Appl. No. 17/014,350, filed Sep. 8, 2020, Optical Non-uniformity Correction (NUC) for Active Mode Imaging Sensors Using Micro-Electro-Mechanical System (MEMS) Micro-Mirror Arrays (MMAs).
"High Contrast IR Wire Grid Polarizers", Edmund Optics, [Online], Retrieved from the Internet: <URL: https://www.edmundoptics.com/f/high-contrast-ir-wire-grid-poiarizers/14797/>, (Accessed Sep. 4, 2021), 1 pg.
"Mid-Wave Infrared (MWIR) and Long-Wave Infrared (LWIF) Waveplates", Edmund Optics, [Online], Retrieved from the Internet: <URL: https://www.edmundoptics.com/f/mid-wave-infrared-mwir-and-long-wave-infrared-lwir-waveplates/14317/>, (Accessed Sep. 4, 2021), 2 pgs.
Anderegg, Jesse, et al., "Coherently Coupled High Power Fiber Arrays", Proc. of SPIE 6102, Fiber Lasers III: Technology, Systems, and Applications 61020U, (2006), 6 pgs.
Augst, S J, et al., "Coherent and spectral beam combining fiber lasers", Proc. SPIE 8237, Fiber Lasers IX: Technology, Systems, and Applications, 823704, (Feb. 13, 2012), 11 pgs.
Ayral, J.-L., et al., "Phase-conjugate Nd:YAG laser with internal acousto-optic beam steering", Optics Letters, vol. 16, No. 16, (Aug. 15, 1991), 1225-1227.
Chiu, Yi, et al., "Shape-Optimized Electrooptic Beam Scanners: Analysis, Design, and Simulation", Journal of Lightwave Technology, vol. 17, No. 1, (Jan. 1999), 108-114.
Fan, T Y, "Laser Beam Combining or High-Power, High-Radiance Sources", IEEE Journal of Selected Topics in Quantum Electronics, vol. 11, No. 3, (May/Jun. 2005), 567-577.
Hacker, Jonathan, et al., "A Ka-Band 3-bit RF MEMS True-Time-Delay Network", IEEE Transactions on Microwave Theory and Techniques, vol. 51, No. 1., (Jan. 2003), 305-308.
Kim, Jihwan, et al., "Wide-angle, nonmechanical beam steering using thin liquid crystal polarization gratings", Proc. of SPIE, vol. 7093, (2008), 12 pgs.
King, D F, et al., "3rd-Generation 1280×720 FPA development status at Raytheon Vision Systems", Proc. of SPIE vol. 6206 62060W-1, (2006), 16 pgs.
Norton, Andrew, et al., "High-Power Visible-Laser Effect on a 37-Segment Iris AO Deformable Mirror", Proc. SPIE 7595, MEMS Adaptive Optics IV, 759506, (Feb. 17, 2010), 12 pgs.
Redmond, Shawn, et al., "Active coherent beam combining of diode lasers", Optics Letters vol. 36, No. 6, (Mar. 15, 2011), 999-1001.
Salmon, J.T., et al., "An Adaptive Optics System for Solid-State Laser Systems used in Inertial Confinement Fusion", First Annual International Conference on Solid-State Lasers for Application of Intertial Confinement Fusion, Monterey, California, May 30-Jun. 2, 1995, (Sep. 17, 1995), 13 pgs.
Siegman, A. E., "Unstable optical resonators for laser applications", Proceedings of the IEEE, vol. 53, Issue 3, (Mar. 1965), 277-287.
Wang, Jinxue, et al., "Doppler Winds Lidar Technology Development and Demonstration", AIAA-2005-6772, Space 2005, Long Beach, California, Aug. 30-1, 2005, 11 pgs.
Yamamoto, R., et al., "Evolution of a Solid State Laser", Proc. SPIE 6552, Laser Source Technology for Defense and Security III, 655205, (May 10, 2007), 11 pgs.
U.S. Appl. No. 17/009,453, filed Sep. 1, 2020, MEMS Micro-Mirror Array Laser Beam Steerer for Simultaneous Illumination of Multiple Tracked Targets.
U.S. Appl. No. 17/029,915, filed Sep. 23, 2020, Coherent Optical Beam Combination Using Micro-Electro-Mechanical System (MEMS) Micro-Mirror Arrays (MMAs) That Exhibit Tip/Tilt/Piston (TTP) Actuation.
U.S. Appl. No. 17/001,125, filed Aug. 24, 2020, Optical True Time Delay (TTD) Device Using Micro-Electrical-Mechanical System (MEMS) Micromirror Arrays (MMAs) That Exhibit Tip/Tilt/Piston (TTP) Actuation.
U.S. Appl. No. 17/024,436, filed Sep. 17, 2020, Active Pushbroom Imaging System Using a Micro-Electro-Mechanical System (MEMS) Micro-Mirror Array (MMA).
U.S. Appl. No. 17/068,517, filed Oct. 12, 2020, Negative Obstacle Detector Using Micro-Electro-Mechanical System (MEMS) Micro-Mirror Array (MMA) Beam Steering.
U.S. Appl. No. 17/152,023, filed Jan. 19, 2021, Small Angle Optical Beam Steering Using Micro-Electro-Mechanical System (MEMS) Micro-Mirror Arrays (MMAs).
U.S. Appl. No. 17/171,577, filed Feb. 9, 2021, Optical Sensor With Micro-Electro-Mechanical System (MEMS) Micro-Mirror Array (MMA) Steering of the Optical Transmit Beam.
U.S. Appl. No. 17/150,286, filed Jan. 15, 2021, Active Imaging Using a Micro-Electro-Mechanical System (MEMS) Micro-Mirror Array (MMA).
U.S. Appl. No. 17/150,330, filed Jan. 15, 2021, Optical System for Object Detection and Location Using a Micro-Electro-Mechanical System (MEMS) Micro-Mirror Array (MMA) Beamsteering Device.
U.S. Appl. No. 17/159,967, filed Jan. 27, 2021, Micro-Electro-Mechanical System (MEMS) Micro-Mirror Array (MMA) Steered Active Situational Awareness Sensor.
U.S. Appl. No. 17/177,755, filed Feb. 17, 2021, Micro-Electro-Mechanical System (MEMS) Micro-Mirror Array (MMA) and Off-Axis Parabola (OAP) Steered Active Situational Awareness Sensor.
U.S. Appl. No. 17/177,784, filed Feb. 17, 2021, Conic Micro-Electro-Mechanical System (MEMS) Micro-Mirror Array (MMA) Steered Active Situational Awareness Sensor.
U.S. Appl. No. 17/231,898, filed Apr. 15, 2021, Optical Scanning System Using Micro-Electro-Mechanical System (MEMS) Micro-Mirror Arrays (MMAs).
U.S. Appl. No. 17/207,177, filed Mar. 19, 2021, Optical Zoom System Using an Adjustable Reflective Fresnel Lens Implemented With a Micro-Electro-Mechanical System (MEMS) Micro-Mirror Array (MMA).
U.S. Appl. No. 17/217,929, filed Mar. 30, 2021, Multiple Field-of-View (FOV) Optical Sensor Using a Micro-Electro-Mechanical System (MEMS) Micro-Mirror Array (MMA).
U.S. Appl. No. 17/211,574, filed Mar. 24, 2021, Optical Non-Uniformity Compensation (NUC) for Passive Imaging Sensors Using Micro-Electro-Mechanical System (MEMS) Micro-Mirror Arrays (MMAs).
U.S. Appl. No. 17/238,147, filed Apr. 22, 2021, Micro-Electro-Mechanical System (MEMS) Micro-Mirror Array (MMA) Steered High-Power Laser Transmitter.
U.S. Appl. No. 17/242,861, filed Apr. 28, 2021, Micro-Electro-Mechanical System (MEMS) Micro-Mirror Array Steered Laser Transmitter and Situational Awareness Sensor With Wavelegth Conversion.
U.S. Appl. No. 17/479,896, filed Sep. 20, 2021, Optical Sensor With MEMS MMA Steered Transmitter and Staring Detector.
U.S. Appl. No. 17/463,225, filed Aug. 31, 2021, Amplified Laser Device Using a MEMS MMA Having Tip, Tilt and Piston Capability to Both Correct a Beam Profile and Steer the Amplified Beam.
U.S. Appl. No. 17/479,927, filed Sep. 20, 2021, Image Polarimeter Using a Micro-Electro-Mechanical System (MEMS) Micro-Mirror Array (MMA).

\* cited by examiner

ELECTRONICALLY STEERED INTER-SATELLITE OPTICAL COMMUNICATION SYSTEM WITH MICRO-ELECTROMECHANICAL (MEM) MICROMIRROR ARRAY (MMA)

PRIORITY CLAIM

This application claims priority under 35 U.S.C. 119 to U.S. Provisional Patent Application Ser. No. 62/903,244, filed Sep. 20, 2019 [reference number 19-13085-US-PSP] which is incorporated herein by reference in its entirety.

TECHNICAL FIELD

Embodiments pertain to optical satellite communications. Some embodiments relate to optical communications between satellites (inter-satellite communications) and between a satellite and a ground station. Some embodiments relate to optical beamsteering.

BACKGROUND

Satellites have a variety of applications, such as earth observation, communication, weather monitoring, navigation, and surveillance, to name a few examples. The size, functionality, and orbit of a particular satellite are typically contingent on the specific purpose of that satellite. In many cases, a satellite may communicate with a ground station, and other satellites, to communicate information and ensure the proper operation of the satellite.

One issue with conventional optical satellite communication that use non-mechanical beamsteering is the limited number of wavelengths that can be used. Thus, what is needed is optical satellite communication that operate over a wide range of wavelengths.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
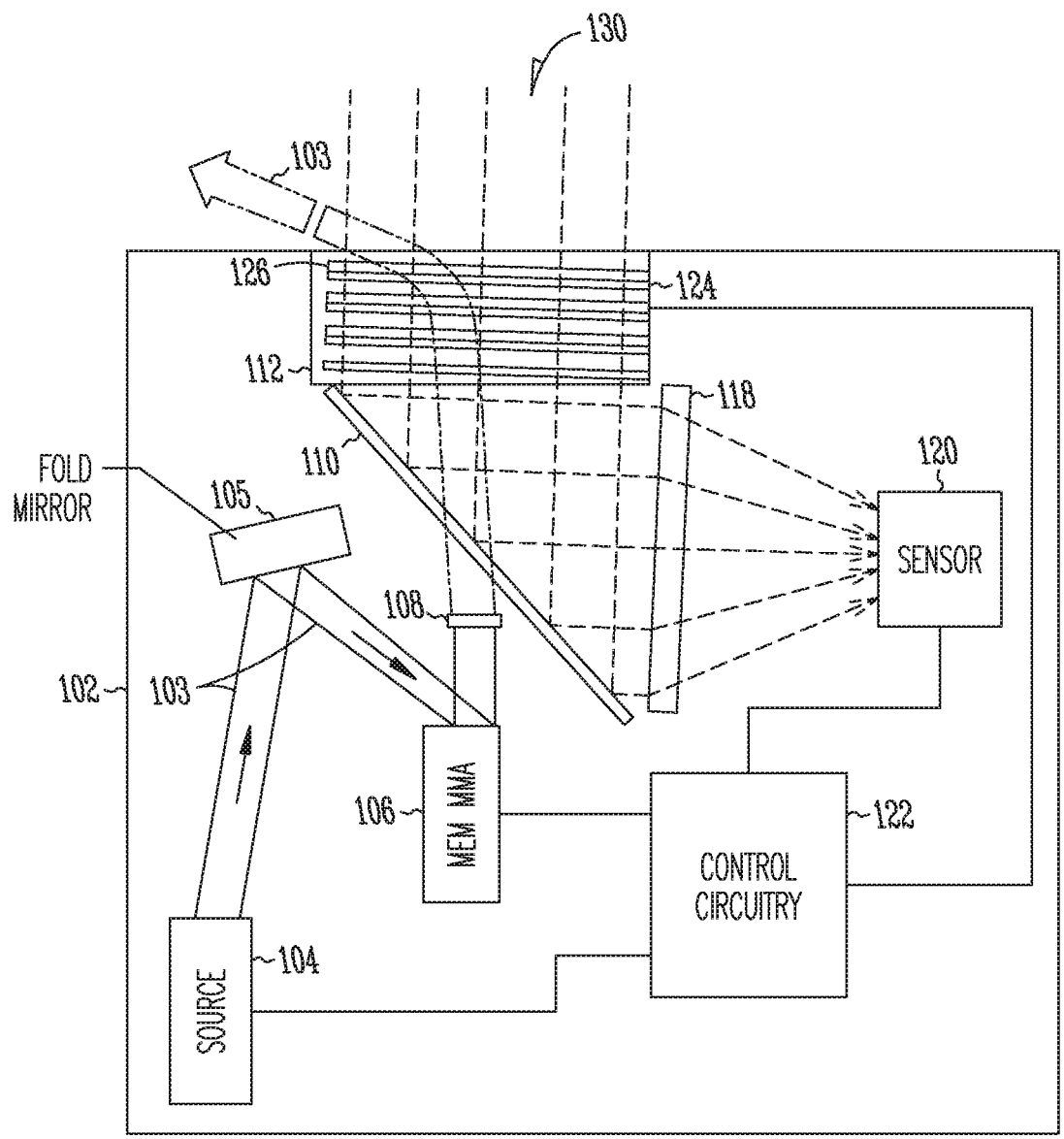
FIG. 1 is a functional diagram of a satellite transceiver in accordance with some embodiments.

FIG. 1 is a functional diagram of a satellite transceiver in accordance with some embodiments. Satellite transceiver 102 may be configurable for inter-satellite communication and may also be configurable for satellite to ground communication. In some embodiments, the satellite transceiver 102 may comprise a micro-electromechanical (MEM) micro-mirror array (MMA) (MEM-MMA) 106 configured to steer a beam 103 of encoded optical data over a field-of-view (FOV). In some embodiments, the satellite transceiver 102 may also comprise coarse steering optics 112 configured to extend a field-of-regard (FOR) of the MEM-MMA 106 relative to the FOV for transmission of the beam 103 of encoded optical data through an aperture 130. In some embodiments, the satellite transceiver 102 may also comprise control circuitry 122 to generate signalling to control the coarse steering optics 112 for transmission of the beam at a deflection angle through the aperture 130. In some embodiments, the control circuitry 122 may generate signalling to control the MEM-MMA 106 to steer the beam 103 over the FOV for fine steering of the beam 103 within the aperture 130. In some embodiments, the MEM-MMA 106 comprises a plurality of individual mirror elements, each of the mirror elements controllable by the control circuitry 122 to steer the beam 103 over the FOV. Aperture 130 may operate as both an entrance aperture and an exit aperture.

Figure 2:
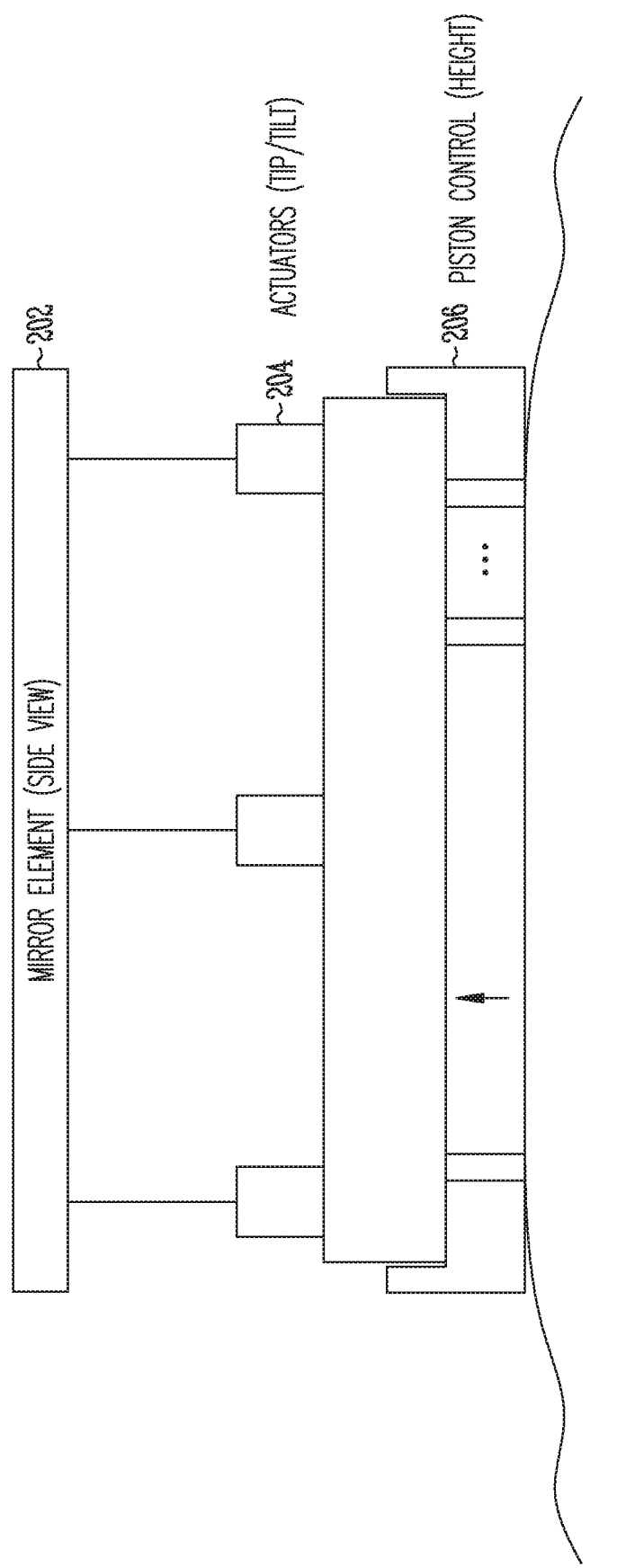
FIG. 2 is a functional diagram illustrating control of a mirror element in accordance with some embodiments.

FIG. 2 is a functional diagram illustrating control of a mirror element in accordance with some embodiments. In these example embodiments, for each mirror element 202, the MEM-MMA 106 may comprise at least one piston 206 and one or more mirror actuators 204. In some embodiments, the piston 206 may be controllable to change the height of an associated mirror element in response to signalling from the control circuitry 122. In some embodiments, the one or more actuators 204 may be controllable to change a tilt and tip of an associated mirror element 202 in response to signalling from the control circuitry 122. Although actuators 202 for tip/tilt and piston 206 for height control are illustrated in FIG. 2 as separate elements, in some embodiments, piston height control functionality is integrated with the tip/tilt actuator functionality.

In some embodiments, the mirror elements 202 may comprise hexagonal shaped mirror elements although the scope of the embodiments is not limited in this respect as circular, square and other shaped mirror elements may be used. In embodiments that use hexagonal shaped mirror elements, gaps between the mirror elements are able to be minimized particularly when the mirror elements are tipped or tilted allowing up to 90% or more of its aperture to be filled. Accordingly, most of the optical signal/energy is able to be transmitted. In some embodiments, the mirror elements 202 have a coating selected based on a range of wavelengths that comprise the beam 103.

In some embodiments, for satellite to ground communications, the control circuitry 122 may be further configured to control a height of each of the mirror elements 202 to adjust a phase front of the beam 103 to compensate for atmospheric distortion based on feedback and cause the beam 103 of encoded optical data to be transmitted through the aperture 130 in a direction of a ground station receiver. The feedback may be received from the ground station receiver.

In some embodiments, piston control of the elevation of the mirror elements wavefront compensation to mitigate effects of atmospheric absorption, scatter, thermal blooming and optical distortion, although the scope of the embodiments is not limited in this respect. The elevation (e.g., height) control may control the relative positions of the mirror elements along an axis coplanar with the mirror's normal.

In some embodiments, for satellite-to-satellite communications (i.e., inter-satellite communication), the control circuitry may be configured to refrain from controlling the height of the mirror elements to compensate for atmospheric distortion, and cause the beam 103 of encoded optical data to be transmitted through the aperture 130 in a direction of another satellite transceiver.

In some embodiments, the beam 103 of encoded optical data comprises a linear polarized beam. In some embodiments, the satellite transceiver 102 may further comprise a quarter wave plate 108 configured to convert the linear polarized beam into a circularly polarized beam. In some embodiments, the coarse steering optics 112 may comprise a stack of polarized gratings 124. Each polarized grating within the stack may comprise a non-mechanical electrically controllable half-wave plate and grating. In some embodiments, each polarized grating of the stack may be configured to convert a circularly polarized beam of encoded optical data into either a left-handed polarization or a right-handed polarization for deflection by the stack. The coarse steering optics may be configured to deflect the beam 103 at the deflection angle based on a handedness of the circular-polarization. In these embodiments, the coarse steering optics 112 are able to provide course beamsteering over discrete predetermined amounts. For example, four polarized gratings 124 may provide beamsteering over +/−4.4 degrees, +/−8.8 degrees, +/−17 degrees, and +/−35 degrees. The MEM-MMA 106 is able to provide beamsteering in fine amounts to allow the beam 103 to be steered over a field of regard of up to about +/−70 degrees from the optical boresight of the satellite transceiver 102 and over 360 degrees in azimuth.

In some embodiments, the beam 103 may be a transmit beam the satellite transceiver 102 may further comprise a beam splitter 110 configured to separate the transmit beam 103 from a receive beam that is received though the aperture 130. In these embodiments, the beam splitter 110 may be configured to direct the transmit beam 103 for direction through the coarse steering optics 112 and to direct (e.g., reflect) the receive beam from the coarse steering optics 112 through a focusing element 118 to an optical sensor 120.

In some embodiments, the control circuitry 122 may be operatively coupled to at least the optical sensor 120 and configured to estimate a trajectory of the satellite transceiver 102 based at least in part on the receive beam.

Some embodiments may include one or more fold mirrors, such as a fold mirror 105, which may be configured to reflect the beam 103 from an optical source 104 to the MEM-MMA 106, although the scope of the embodiments is not limited in this respect. The inclusion of a fold mirror 105 is optional and may depend on the layout of the illustrated elements of the satellite transceiver 102.

In some embodiments, the satellite transceiver may further comprise an optical source 104 configured to generate the beam 103 encoded optical data comprising multiple wavelengths. In these embodiments, the satellite transceiver 102 may be configured to transmit and receive multiple wavelengths of simultaneously. In some of these multi-wavelength embodiments, the polarized gratings 124 and beam splitter 110, for example, may be configured for each wavelength, although the scope of the embodiments is not limited in this respect.

Some embodiments are directed to a satellite transceiver 102 that is configurable for inter-satellite communication and configurable for satellite to ground communication. In these embodiments, the satellite transceiver 102 may comprise an aperture 130, a micro-electromechanical (MEM) micro-mirror array (MMA) (MEM-MMA) beamsteering device 106 configured to steer a transmit beam 103 of encoded optical data over a field-of-view (FOV), and coarse steering optics 112 configured to extend a field-of-regard (FOR) of the MEM-MMA beamsteering device 106 relative to the FOV of the MEM-MMA beamsteering device 106.

In these embodiments, during a transmit mode of operation of the satellite transceiver 102, the coarse steering optics 112 may be positioned to transmit the transmit beam 103 of encoded optical data through the aperture 130 in a direction of a location of another satellite transceiver. The location of the other satellite transceiver may be based on ephemeris information received at the satellite transceiver 102.

In some embodiments, the satellite transceiver 102 may also include a beam splitter 110 configured, during the transmit mode of operation of the satellite transceiver 102, to receive the transmit beam 103 of encoded optical data along a transmit path of the satellite transceiver 102 and to direct the transmit beam 103 of encoded optical data to the coarse steering optics 112. In these embodiments, during a receive mode of operation of the satellite transceiver 102, the beam splitter 110 may be configured to receive a received beam of encoded optical data from the another satellite transceiver through the aperture 130 and direct the received beam of encoded optical data along a receive path, the receive path being distinct from the transmit path.

In some embodiments, the satellite transceiver 102 may also include control circuitry 122 configured to switch operation of the satellite transceiver 102 from the transmit mode to the receive mode at an expiration of a duration of the transmit mode, an optical sensor 120 positioned along the receive path to collect the received beam of encoded optical data, and an optical focusing element positioned in the receive path and configured to focus the received beam of encoded optical data onto the optical sensor 120. In these embodiments, the MEM-MMA beamsteering device 106 may comprises one or more of individual mirror elements 202. Each of the mirror elements 202 may be controllable by the control circuitry 122 to steer the transmit beam 103 of encoded optical data over the field of view.

In some embodiments, the satellite transceiver may further comprise an optical source 104 configured to generate the transmit beam 103 of encoded optical data. In some embodiments, the transmit beam 103 of encoded optical data has a linear polarization.

In some embodiments, the control circuitry 122 may be operatively coupled to at least the optical source 104, the MEM-MMA beamsteering device 106, and the coarse steering optics 112. The control circuitry 122 may be configured to control the optical source 104, the MEM-MMA beamsteering device 106, and the coarse steering optics 112 to switch between the transmit mode and the receive mode of the satellite transceiver 102.

In some embodiments, the satellite transceiver may further comprise a quarter-wave plate 108 interposed between the MEM-MMA beamsteering device 106 and the beam splitter 110. In some embodiments, the quarter wave-plate 108 may be configured to convert the linear-polarization to a circular-polarization. In some embodiments, the coarse steering optics 112 may be configured to detect the transmit beam 103 of encoded optical data at an angle based on a handedness of the circular-polarization.

In some embodiments, the control circuitry 122 may be operatively coupled to at least the optical sensor 120 and configured to estimate a trajectory of the satellite transceiver 102 based at least in part on the receive beam of encoded optical data.

In some embodiments, heights of the individual mirror elements 202 of the MEM-MMA beamsteering device 106 may be controlled to compensate for atmospheric distortion. In these embodiments, the control circuitry 122 may configure the MEM-MMA beamsteering device 106 to steer the transmit beam 103 of encoded optical data over the field of view and to control the heights of the individual mirror elements 202 to compensate for the atmospheric distortion. In some embodiments, the mirror elements 202 may be configured to maximize reflectivity of the array when the individual mirror elements 202 are tipped, tilted or heights are changed.

In some embodiments, the aperture 130, the MEM-MMA beamsteering device 106, the coarse steering optics 112, the beam splitter 110, the optical sensor 120 and the optical focusing element, the optical source 104, the quarter-wave plate 108 and the control circuitry 122 may be configured to steer, transmit and receive, detect encoded optical data at an angle based on a handedness of circular polarization and estimate a trajectory of the satellite transceiver 102 by transmitting and receiving encoded optical data of multiple optical wavelengths, although the scope of the embodiments is not limited in this respect.

In some embodiments, the transmit and receive beams of encoded optical data may comprise multiple wavelengths and are configured to be transmitted and received simultaneously. In these embodiments, the optical source 104 may be configured to generate beams of encoded optical data at multiple wavelengths.

In some embodiments, the transmit beam 103 may comprise a plurality of individual beams of encoded optical data where each individual beam comprising a single wavelength. In some embodiments, the control circuitry 122 may be configured to control the individual mirror elements 202 or groups of the individual mirror elements 202 to steer each individual beam over the field of view in a different (e.g., possibly unique) direction. In some embodiments, the control circuitry 122 may be further configured to control the heights of the individual mirror elements 202 to compensate for atmospheric distortion associated with each individual beam of a single wavelength.

Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some embodiments may include one or more processors and may be configured with instructions stored on a computer-readable storage device.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A satellite transceiver configurable for multi-wavelength inter-satellite communication and configurable for multi-wavelength satellite to ground communication, the satellite transceiver comprising:
a micro-electromechanical (MEM) micro-mirror array (MMA) (MEM-MMA) configured to steer a multi-wavelength beam of encoded optical data over a field-of-view (FOV), the multi-wavelength beam comprising a range of wavelengths;
coarse steering optics comprising a stack of multi-wavelength polarized gratings configured to extend a field-of-regard (FOR) of the MEM-MMA relative to the FOV for transmission of the multi-wavelength beam of encoded optical data through an aperture; and
control circuitry to generate signalling to control the coarse steering optics for transmission of the multi-wavelength beam at a deflection angle through the aperture,
the control circuitry to further to generate signalling to control the MEM-MMA to steer the multi-wavelength beam over the FOV for fine steering of the beam within the aperture; and
wherein the MEM-MMA comprises a plurality of individual mirror elements, each of the mirror elements controllable by the control circuitry to steer the multi-wavelength beam over the FOV,
wherein the mirror elements include a coating selected for improved reflectivity within the range of wavelengths that comprise the multi-wavelength beam, and
wherein the multi-wavelength polarized gratings are responsive to the signalling to extend the FOR for wavelengths within the range of wavelengths that comprise the multi-wavelength beam.

2. The satellite transceiver of claim 1, wherein for satellite to ground communications, the control circuitry is further configured to:
control a height of each of the mirror elements to adjust a phase front of the multi-wavelength beam to compensate for atmospheric distortion based on feedback; and
transmit the multi-wavelength beam of encoded optical data through the aperture in a direction of a ground station receiver, the feedback received from the ground station receiver.

3. The satellite transceiver of claim 2, wherein for satellite-to-satellite communications, the control circuitry is configured to:
refrain from controlling the height of the mirror elements to compensate for atmospheric distortion; and
transmit the multi-wavelength beam of encoded optical data through the aperture in a direction of another satellite transceiver.

4. The satellite transceiver of claim 3, wherein for each mirror element, the MEM-MMA comprises at least one piston and one or more mirror actuators,
wherein the piston is controllable to change the height of an associated mirror element in response to signalling from the control circuitry, and
wherein the one or more actuators are controllable to change a tilt and tip of an associated mirror element in response to signalling from the control circuitry.

5. The satellite transceiver of claim 4, wherein the mirror elements comprise hexagonal shaped mirror elements.

6. The satellite transceiver of claim 5, wherein for multi-beam transmission, the MEM-MMA is configured to steer a plurality of individual beams of encoded optical data over the FOV, each individual beam comprising a single wavelength within the range of wavelengths, and
wherein the control circuitry is configurable to control the individual mirror elements or groups of the individual mirror elements to steer ach individual beam over the FOV in a different direction.

7. The satellite transceiver of claim 4, wherein the multi-wavelength beam of encoded optical data comprises a linear polarized beam, and
wherein the satellite transceiver further comprises, a quarter wave plate configured to convert the linear polarized beam into a circularly polarized beam, and wherein each polarized grating within the stack comprising a non-mechanical electrically controllable half-wave plate and grating, wherein each polarized grating of the stack is configured to convert a circularly polarized beam of encoded optical data into either a left-handed polarization or a right-handed polarization for deflection by the stack, the coarse steering optics configured to deflect the multi-wavelength beam at the deflection angle based on a handedness of the circular-polarization.

8. The satellite transceiver of claim 7, wherein the multi-wavelength beam is a transmit beam, and wherein the satellite transceiver further comprises:
a beam splitter configured to separate the transmit beam from a receive beam that is received though the aperture, the beam splitter to direct the transmit beam for direction through the coarse steering optics and to direct the receive beam from the coarse steering optics through a focusing element to an optical sensor.

9. The satellite transceiver of claim 8, wherein the control circuitry is operatively coupled to at least the optical sensor and configured to estimate a trajectory of the satellite transceiver based at least in part on the receive beam.

10. The satellite transceiver of claim 9 further comprising an optical source configured to generate the multi-wavelength beam encoded optical data comprising the multiple wavelengths, the satellite transceiver configured to transmit and receive multiple wavelengths of simultaneously.

11. A satellite transceiver configurable for inter-satellite communication and configurable for satellite to ground communication, the satellite transceiver comprising:
an aperture;
a micro-electromechanical (MEM) micro-mirror array (MMA) (MEM-MMA) beamsteering device configured to steer a transmit beam of encoded optical data over a field-of-view (FOV); and
coarse steering optics comprising a stack of multi-wavelength polarized gratings configured to extend a field-of-regard (FOR) of the MEM-MMA beamsteering device relative to the FOV of the MEM-MMA beamsteering device,
wherein during a transmit mode of operation of the satellite transceiver, the coarse steering optics are positioned to transmit the transmit beam of encoded optical data through the aperture in a direction of a location of another satellite transceiver, the location of the another satellite transceiver based on ephemeris information received at the satellite transceiver;
a beam splitter configured, during the transmit mode of operation of the satellite transceiver, to receive the transmit beam of encoded optical data along a transmit path of the satellite transceiver and to direct the transmit beam of encoded optical data to the coarse steering optics,
wherein during a receive mode of operation of the satellite transceiver, the beam splitter is configured to receive a received beam of encoded optical data from the another satellite transceiver through the aperture and direct the received beam of encoded optical data along a receive path, the receive path being distinct from the transmit path;
control circuitry configured to switch operation of the satellite transceiver from the transmit mode to the receive mode at an expiration of a duration of the transmit mode;
an optical sensor positioned along the receive path to collect the received beam of encoded optical data; and
an optical focusing element positioned in the receive path and configured to focus the received beam of encoded optical data onto the optical sensor,
wherein the MEM-MMA beamsteering device comprises one or more of individual mirror elements, each of the mirror elements controllable by the control circuitry to steer the transmit beam of encoded optical data over the field of view,
wherein for multi-beam transmission, the MEM-MMA is configured to steer a plurality of individual beams of encoded optical data over the FOV, each individual beam comprising a single wavelength within the range of wavelengths,
wherein the control circuitry is configurable to control the individual mirror elements or groups of the individual mirror elements to steer each individual beam over the FOV in a different direction.

12. The satellite transceiver of claim 11, further comprising an optical source configured to generate the transmit beam of encoded optical data, wherein the transmit beam of encoded optical data has a linear polarization.

13. The satellite transceiver of claim 12, wherein the control circuitry is operatively coupled to at least the optical source, the MEM-MMA beamsteering device, and the coarse steering optics, the control circuitry being configured to control the optical source, the MEM-MMA beamsteering device, and the coarse steering optics to switch between the transmit mode and the receive mode of the satellite transceiver.

14. The satellite transceiver of claim 13, further comprising a quarter-wave plate interposed between the MEM-MMA beamsteering device and the beam splitter, the quarter wave-plate configured to convert the linear-polarization to a circular-polarization, wherein the coarse steering optics are configured to detect the transmit beam of encoded optical data at an angle based on a handedness of the circular-polarization.

15. The satellite transceiver of claim 11, wherein the control circuitry is operatively coupled to at least the optical sensor and configured to estimate a trajectory of the satellite transceiver based at least in part on the receive beam of encoded optical data.

16. The satellite transceiver of claim 11, wherein heights of the individual mirror elements of the MEM-MMA beamsteering device are controlled to compensate for atmospheric distortion, and
wherein the control circuitry configures the MEM-MMA beamsteering device to steer the transmit beam of encoded optical data over the field of view and to control the heights of the individual mirror elements to compensate for the atmospheric distortion.

17. The satellite transceiver of claim 16 wherein the aperture, the MEM-MMA beamsteering device, the coarse steering optics, the beam splitter, the optical sensor and the optical focusing element, an optical source, a quarter-wave plate and the control circuitry are configured to steer, transmit and receive, detect encoded optical data at an angle based on a handedness of circular polarization and estimate a trajectory of the satellite transceiver by transmitting and receiving encoded optical data of multiple optical wavelengths.

18. The satellite transceiver of claim 17 wherein the transmit and receive beams of encoded optical data comprise multiple wavelengths and are configured to be transmitted and received simultaneously, and
wherein the optical source configured to generate beams of encoded optical data at multi wavelengths.

19. A satellite transceiver configurable for inter-satellite communication and configurable for satellite to ground communication, the satellite transceiver comprising:
- an aperture;
- a micro-electromechanical (MEM) micro-mirror array (MMA) (MEM-MMA) beamsteering device configured to steer a transmit beam of encoded optical data over a field-of-view (FOV); and
- coarse steering optics configured to extend a field-of-regard (FOR) of the MEM-MMA beamsteering device relative to the FOV of the MEM-MMA beamsteering device,
- wherein during a transmit mode of operation of the satellite transceiver, the coarse steering optics are positioned to transmit the transmit beam of encoded optical data through the aperture in a direction of a location of another satellite transceiver, the location of the another satellite transceiver based on ephemeris information received at the satellite transceiver;
- a beam splitter configured, during the transmit mode of operation of the satellite transceiver, to receive the transmit beam of encoded optical data along a transmit path of the satellite transceiver and to direct the transmit beam of encoded optical data to the coarse steering optics,
- wherein during a receive mode of operation of the satellite transceiver, the beam splitter is configured to receive a received beam of encoded optical data from the another satellite transceiver through the aperture and direct the received beam of encoded optical data along a receive path, the receive path being distinct from the transmit path;
- control circuitry configured to switch operation of the satellite transceiver from the transmit mode to the receive mode at an expiration of a duration of the transmit mode;
- an optical sensor positioned along the receive path to collect the received beam of encoded optical data; and
- an optical focusing element positioned in the receive path and configured to focus the received beam of encoded optical data onto the optical sensor,
- wherein the MEM-MMA beamsteering device comprises one or more of individual mirror elements, each of the mirror elements controllable by the control circuitry to steer the transmit beam of encoded optical data over the field of view,
- wherein heights of the individual mirror elements of the MEM-MMA beamsteering device are controlled to compensate for atmospheric distortion,
- wherein the control circuitry configures the MEM-MMA beamsteering device to steer the transmit beam of encoded optical data over the field of view and to control the heights of the individual mirror elements to compensate for the atmospheric distortion,
- wherein the aperture, the MEM-MMA beamsteering device, the coarse steering optics, the beam splitter, the optical sensor and the optical focusing element, an optical source, a quarter-wave plate and the control circuitry are configured to steer, transmit and receive, detect encoded optical data at an angle based on a handedness of circular polarization and estimate a trajectory of the satellite transceiver by transmitting and receiving encoded optical data of multiple optical wavelengths,
- wherein the transmit and receive beams of encoded optical data comprise multiple wavelengths and are configured to be transmitted and received simultaneously,
- wherein the optical source configured to generate beams of encoded optical data at multiple wavelengths,
- wherein the transmit beam comprises a plurality of individual beams of encoded optical data, each individual beam comprising a single wavelength,
- wherein the control circuitry is configured to control the individual mirror elements or groups of the individual mirror elements to steer each individual beam over the field of view in a different direction, and
- wherein the control circuitry is further configured to control the heights of the individual mirror elements to compensate for atmospheric distortion associated with each individual beam of a single wavelength.

20. A method performed by a satellite transceiver for multi-wavelength inter-satellite communication and for multi-wavelength satellite to ground communication, the method comprising:
- steering a multi-wavelength beam of encoded optical data over a field-of-view (FOV) with a micro-electromechanical (MEM) micro-mirror array (MMA) (MEM-MMA), the multi-wavelength beam comprising a range of wavelengths;
- configuring coarse steering optics to extend a field-of-regard (FOR) of the MEM-MMA relative to the FOV for transmission of the multi-wavelength beam of encoded optical data through an aperture, wherein the coarse steering optics comprising a stack of multi-wavelength polarized gratings;
- generating signalling to control the coarse steering optics for transmission of the multi-wavelength beam at a deflection angle through the aperture; and
- generating signalling to control the MEM-MMA to steer the multi-wavelength beam over the FOV for fine steering of the beam within the aperture,
- wherein the MEM-MMA comprises a plurality of individual mirror elements, each of the mirror elements controllable to steer the beam over the FOV,
- wherein the mirror elements include a coating selected for improved reflectivity within the range of wavelengths that comprise the multi-wavelength beam, and
- wherein the multi-wavelength polarized gratings are responsive to the signalling to extend the FOR for wavelengths within the range of wavelengths that comprise the multi-wavelength beam.

* * * * *